US012592274B1

(12) United States Patent
Gupta et al.

(10) Patent No.: US 12,592,274 B1
(45) Date of Patent: Mar. 31, 2026

(54) NON-RETENTION MODE LEAKAGE REDUCTION WITHOUT IMPACTING THE CELL CONTENT IN THE RETENTION MODE

(71) Applicant: Synopsys, Inc., Sunnyvale, CA (US)

(72) Inventors: Gaurav Gupta, New Delhi (IN); Sanjay Kumar Yadav, Noida (IN)

(73) Assignee: Synopsys, Inc., Sunnyvale, CA (US)

( * ) Notice: Subject to any disclaimer, the term of this patent is extended or adjusted under 35 U.S.C. 154(b) by 330 days.

(21) Appl. No.: 18/242,195

(22) Filed: Sep. 5, 2023

(51) Int. Cl.
*G11C 11/40* (2006.01)
*G11C 5/14* (2006.01)
*G11C 11/4072* (2006.01)
*G11C 11/4074* (2006.01)

(52) U.S. Cl.
CPC .......... *G11C 11/4074* (2013.01); *G11C 5/146* (2013.01); *G11C 11/4072* (2013.01)

(58) Field of Classification Search
CPC .. G11C 11/4074; G11C 5/146; G11C 11/4072
See application file for complete search history.

(56) References Cited

U.S. PATENT DOCUMENTS

2011/0261629 A1* 10/2011 Seshadri ............... G11C 11/417
365/189.09
2014/0036612 A1* 2/2014 Rai ....................... G11C 11/417
365/227

* cited by examiner

*Primary Examiner* — Xiaochun L Chen
(74) *Attorney, Agent, or Firm* — Patterson + Sheridan, LLP

(57) ABSTRACT

Techniques for non-retention mode leakage reduction without impacting cell content in a retention mode. A plurality of power gate circuits provide power to respective regions of memory cells. The power gate circuits may be placed physically proximate to the respective regions of the memory cells, and the control circuitry may be placed in a central location of the circuit. The power gate circuits include respective first and second series-connected transistors. Threshold voltages of the first transistors may be less than threshold voltages of the respective second transistors. The first transistors may be controlled independent of the respective second transistors. A third transistor may diode-connect the first transistors, or a subset thereof, in a retention mode. The power gate circuits may include multiple individually controllable first transistors in parallel with one another.

20 Claims, 8 Drawing Sheets

NON-RETENTION MODE LEAKAGE REDUCTION WITHOUT IMPACTING THE CELL CONTENT IN THE RETENTION MODE

TECHNICAL FIELD

The present disclosure generally relates to an electronic circuit. In particular, the present disclosure relates to non-retention mode leakage reduction without impacting cell content in retention mode.

BACKGROUND

Leakage currents are a cause of power consumption/loss in integrated circuits (ICs). For example, as increasing numbers of memory cells are packed onto integrated circuits to meet increasing performance requirements, leakage power consumed by memory arrays may be the most prominent cause of power consumption/loss of an IC device. Leakage power may be reduced by reducing a supply voltage of the memory cells to a minimum data retention voltage (DRV) of the memory cells. Circuitry to reduce the supply voltage may, however, introduce additional leakage.

SUMMARY

Embodiments herein relate to non-retention mode leakage reduction without impacting cell content in the retention mode.

In an embodiment, a circuit includes memory cells and a plurality of power gate circuits that provide power to respective regions of the memory cells. The power gate circuits include respective first and second series-connected transistors. Threshold voltages of the first transistors are less than threshold voltages of the respective second transistors.

The circuit may further include control circuitry that controls the first transistors independent of the second transistors. The control circuitry may include a control circuit that controls states of the first transistors, and a third transistor configured to diode-connect the first transistors in a retention mode. The power gate circuits may be placed physically proximate to the respective regions of the memory cells, and the control circuitry may be placed in a central location of the circuit.

A first one of the power gate circuits may include multiple individually controllable first transistors in parallel with one another. The control circuit may include a third transistor that diode-connects a first subset of the multiple individually controllable first transistors, a fourth transistor that diode-connects a second subset of the multiple individually controllable first transistors, where the third and fourth transistors are controlled independent of one another. Threshold voltages of the multiple individually controllable first transistors may be less than the threshold voltage of the respective second transistor. The threshold voltage of a first subset of the multiple individually controllable first transistors may differ from the threshold voltage of a second subset of the multiple individually controllable first transistors.

In another embodiment, a circuit includes memory cells and a plurality of power gate circuits that provide power to respective regions of the memory cells, the power gate circuits include respective first and second series-connected transistors, and the circuit further includes control circuitry that controls the first transistors independent of the second transistors.

In another embodiment, a circuit includes a power gate circuit that provides power to a load, the power gate circuit includes first and second series-connected transistors, and a threshold voltage of the first transistor is less than a threshold voltage of the second transistor. The circuit may further include a third transistor that diode-connects the first transistor in a reduced power consumption mode.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

DETAILED DESCRIPTION

Figure 1:
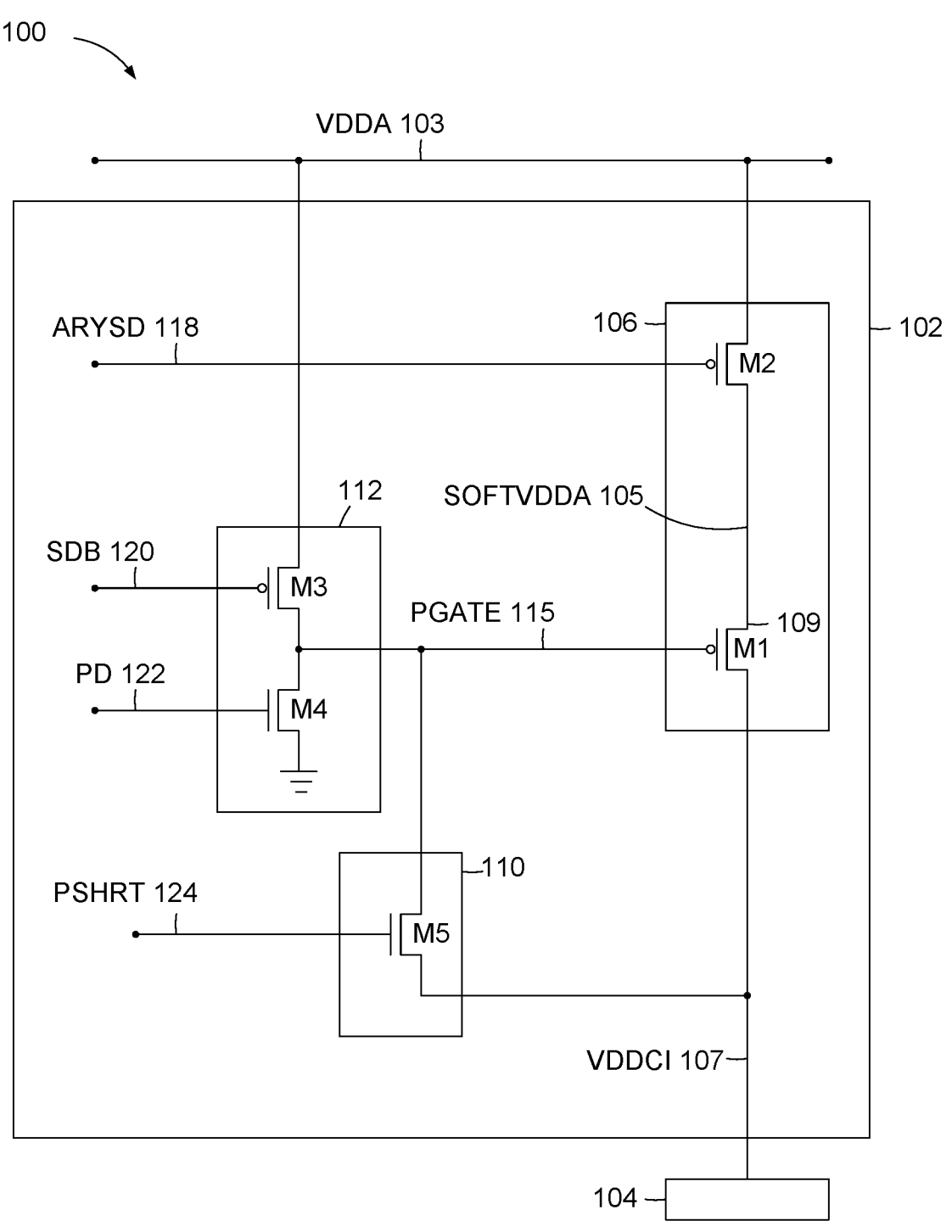
FIG. 1 is a schematic diagram of a circuit that includes bias circuitry that controls a voltage of a load (e.g., memory cells), according to an embodiment.

Aspects of the present disclosure relate to non-retention mode leakage reduction without impacting cell content in the retention mode.

A threshold voltage ($V_T$) of a transistor is the minimum gate-to-source voltage ($V_{GS}$) needed to create a conducting path between source and drains of the transistor. Threshold voltages may fall within one of multiple groups, which may include high-$V_T$, standard-$V_T$, low-$V_T$, ultra-low-$V_T$, and super-low-$V_T$.

Lower $V_T$ transistors have a lower drain-to-source voltage drop (VDS) and consume less power than high-$V_T$ transistors. High-$V_T$ transistors, however, have relatively low leakage current in the OFF state, whereas lower $V_T$ transistors have higher leakage current in the OFF state. Some power gating techniques thus use high-$V_T$ transistors as header switches to shut off a power supply to a circuitry (e.g., memory cells).

Techniques disclosed herein include power gating techniques to suppress leakage current in a lower-$V_T$ power gate transistor when the lower-$V_T$ power gate transistor is in the OFF state.

In an embodiment, bias circuitry controls a supply voltage of a load (e.g., memory cells). The bias circuitry may set the supply voltage to an operating voltage to maintain the memory cells in an operating mode, and may reduce the supply voltage to a minimum data retention voltage (DRV) to maintain the memory cells in a retention mode (i.e., a low power consumption mode), or to zero volts to place the memory cells in a non-retention, or shutdown mode.

The bias circuitry includes a power gate circuit that provides the operating voltage to the load, and a voltage reduction circuit (e.g., a diode-connecting transistor) that reduces the operating voltage to the minimum DRV in the retention mode. In order prevent the operating voltage from falling below the minimum DRV in the retention mode (i.e., to minimize the voltage drop across the power gate circuit), the power gate circuit may include a first transistor that has a relatively low threshold voltage, $V_T$ (e.g., low-$V_T$, ultra-low-$V_T$, or super-low-$V_T$). Since a relative low $V_T$ transistor may incur more leakage current than a high $V_T$ transistor, the power gate circuit may include a second transistor connected in series with the first transistor (i.e., stacked transistors), which reduces the overall leakage.

The first and second transistors may be controlled independent of one another. In an embodiment, the first transistor is controlled in part by the voltage reduction circuitry. In an embodiment, the second transistor has a relatively high $V_T$ to further reduce leakage (e.g., a high-$V_T$ of a power gate transistor, and/or a $V_T$ that is higher than the $V_T$ of the first transistor). Multiple instances of the power gate circuit may control power to respective regions of memory cells, and may be placed physically proximate to the respective regions of the memory cells.

Techniques disclosed herein may be used without impacting memory cell retention in the operating mode or the retention mode.

FIG. 1 is a schematic diagram of a circuit 100 that includes bias circuitry 102 that controls a voltage VDDCI 107 of a load 104, according to an embodiment. Circuit 100 may represent a physical circuit or a machine-readable template that a circuit designer can employ as part of a circuit design process. Circuit 100, or a portion thereof, may represent, for example, a template of a memory compiler (e.g., of an electronic design automation (EDA) process). Circuit 100 may be implemented within an integrated circuit (IC) device, which may include a processor configured to access memory cells of load 104.

Circuit 100 is described below for an example in which load 104 includes memory cells (e.g., an array of memory cells). Circuit 100 is not, however, limited to use with memory cells. In the examples below, bias circuitry 102 is controllable to place load 104 in an operating mode (i.e., high voltage mode), a retention mode (i.e., a reduced power consumption/reduced leakage mode), and a non-retention mode (i.e., shutdown or OFF mode). In the operating mode, bias circuitry 102 may set voltage VDDCI 107 to a voltage VDDA 103 of a power supply rail. In the operating mode, data may be written to and/or read from the memory cells. In the retention mode, bias circuitry 102 may reduce voltage VDDCI 107 to a minimum data retention voltage (DRV) of memory cells of load 104. In the retention mode, the voltage applied to the memory cells is sufficient to preclude loss of data stored in the memory cells, but is generally insufficient to permit read and write operations. When data is to be written to or read from the memory cells, bias circuitry 102 may switch back to the operating mode. In the non-retention mode, bias circuitry 102 may pull voltage VDDCI 107 to a reference voltage (e.g., ground). In the non-retention mode, any data stored in the memory cells is essentially lost or unrecoverable.

In the example of FIG. 1, bias circuitry 102 includes a power gate circuit 106 that includes a first transistor M1 that is controllable to set voltage VDDCI 107 to a voltage SOFTVDDA 105. Bias circuitry 102 further includes a control circuit 112 that controls an ON/OFF state of transistor M1 via a control PGATE 115. In the example of FIG. 1, control circuit 112 includes transistors M3 and M4, which are controlled by respective controls SDB 120 and PD 122. When controls SDB 120 and PD 122 are pulled high, transistor M3 turns OFF and transistor M4 turns ON, which pulls control PGATE 115 low via transistor M4. When control PGATE 115 is pulled low, transistor M1 turns ON. Conversely, when controls SDB 120 and PD 122 are pulled low, transistor M3 turns ON and transistor M4 turns off, which pulls up control PGATE 115 to VDDA via transistor M3. When control PGATE 115 is pulled up to VDDA, transistor M1 turns OFF. When transistor M1 is ON, voltage SOFTVDDA 105 is provided to load 104 via transistor M1. When transistor M1 is OFF, transistor M1 isolates load 104 from voltage SOFTVDDA 105.

Power gate circuit 106 further includes a second transistor M2, which is described further below.

Bias circuitry 102 further includes a voltage reduction circuit 110 that reduces voltage VDDCI 107 in the retention mode, based on a control PSHRT 124. In the example of FIG. 1, voltage reduction circuit 110 includes a diode-coupling transistor M5 that selectively configures transistor M1 as a diode based on a control PSHRT 124. When control PSHRT 124 is pulled high, transistor M5 turns ON and diode-connects transistor M1 (i.e., connects gate and drain nodes of transistor M1 to one another. Diode-connecting transistor M1 increases a voltage drop across transistor M1, which decreases voltage VDDCI 107.

In the operating mode, transistor M1 is ON (PGATE 115 is pulled low) and transistor M5 is OFF (PSHRT is pulled low). In this configuration, there is negligible voltage drop across source and drains (i.e., Vas) of transistor M1 such that voltage VDDCI 107 is approximately equal to voltage SOFTVDDA 105. In the non-retention mode, M1 and M5 are OFF and voltage VDDI 107 is essentially zero (i.e., an open circuit).

In the retention mode, transistor M1 is ON (PGATE 115 is pulled high) and diode-connected (PSHRT 124 is pulled high and transistor M5 is ON). In this configuration, there is a non-negligible voltage drop across transistor M1 (i.e., Vas), resulting in a reduced voltage VDDCI 107 (i.e., less than voltage SOFTVDDA 105). The voltage drop across transistor M1 depends on a threshold voltage ($V_T$) of transistor M1, in that a higher $V_T$ results in a higher voltage drop, and thus a lower voltage VDDCI 107. The transistor threshold voltage is a gate voltage at which significant current starts to flow from a source node of a transistor to a drain node of the transistor.

Care should be taken to ensure that the voltage drop across transistor M1 does not reduce voltage VDDCI 107 below a minimum DRV specification of load 104. In other words, if the threshold voltage of transistor M1 to too high, voltage VDDCI 107 may fall below the minimum DRV specification of load 104. As an example, and without limitation, load 104 may be designed for an operating voltage of approximately 700 millivolts and a minimum DRV of approximately 600 millivolts. Voltage VDDA 103 may be set to, for example, 700 millivolts such that, in the operating mode, voltage VDDCI 107 is substantially equal to 700 millivolts. In the retention mode (i.e., transistor M1 is diode-coupled), if transistor M1 has a relatively high threshold voltage of, for example, 300 millivolts, voltage VDDCI 107 may be reduced from approximately 700 millivolts to approximately 400 millivolts, which is below the minimum DRV of load 104.

In an embodiment, transistor M1 is designed or selected to have a relatively low threshold voltage. As an example, and without limitation, transistor M1 may have a threshold voltage of approximately 100 millivolts (i.e., an ultra-low threshold voltage). In this example, in the retention mode, voltage VDDCI 107 may be reduced from approximately 700 millivolts to approximately 600 millivolts, which meets the minimum DRV of load 104.

A transistor having a relatively low threshold voltage is, however, more prone to leakage current than a transistor having a relatively high threshold voltage. For example, in FIG. 1, if a drain 109 of transistor M1 were coupled directly to voltage VDDA 103, a relatively low $V_T$ of transistor M1 may result in leakage current in transistor M1 in the shutdown mode (i.e., when voltage VDDA 103 is applied to the gate and source of transistor M1).

To reduce or preclude leakage current in transistor M1 in the shutdown mode, power gate circuit 106 further includes second transistor M2 that is controllable to selectively set voltage SOFTVDDA 105 to voltage VDDA 103, based on a control ARYSD 118. In both the operating mode and the retention mode, ARYSD 118 is pulled low to turn transistor M2 ON. Transistor M2 thus does not impact cell retention in the operating mode or the retention mode. In the shutdown mode, ARYSD 118 is pulled high to turn transistor M2 OFF, which essentially isolates transistor M1 from voltage VDDA 103, which substantially precludes leakage current in transistor M1.

In an embodiment, the threshold voltage of transistor M2 is greater than the threshold voltage of transistor M1. The threshold voltage of transistor M2 may be relatively large, such as that of a high $V_T$ power gate transistor (e.g., a $V_T$ of approximately 500 mV), such that transistor M2 does not present a significant leakage issue in the shutdown mode. As an example, and without limitation, where transistor M1 has a threshold of approximately 100 millivolts, transistor M2 may have a threshold voltage of approximately 300 millivolts (mV). As another example, the threshold voltage of transistor M1 may be within a range of approximately 75 mV to 125 mV, and the threshold voltage of transistor M2 may be within a range of approximately 275 mV to 325 mV.

The threshold voltage of transistor M1 may be expressed as a percentage of the threshold voltage of transistor M2, and vice versa. In an embodiment, the threshold voltage of transistor M1 is within a range of 30% to 80% of the threshold voltage of transistor M2. For example, where the threshold voltage of transistor M2 is approximately 500 mV, the threshold voltage of transistor M1 may be within a range of approximately 90 mV to 240 mV. Threshold voltages of transistors M1 and M2 are not, however, limited to the foregoing examples.

In another embodiment, the threshold voltage of transistor M2 is similar to, or even less than a threshold voltage of transistor M1. Although a lower threshold voltage may result in a slight increase in leakage current in M2 in the shutdown mode, the leakage will be relatively small due to the stacking effect in which the combined leakage of two series-coupled (i.e., stacked) transistors in the OFF state is less than the leakage of a single transistor in the OFF state.

In the example of FIG. 1, transistors M1, M2, and M3 are illustrated as P-type devices, and transistors M4 and M5 are illustrated as N-type devices. In this example, voltage VDDA 103 may represent a positive voltage. In an alternative embodiment, transistors M1, M2, and M3 are N-type devices, and transistors M4 and M5 are P-type devices. In this alternative embodiment, voltage VDDA 103 may be a negative voltage. Bias circuitry 102 is not, however, limited to the foregoing examples. Transistors M1, M2, M3, M4, and M5 may include metal oxide semiconductor field effect transistors (MOSFETs).

Transistor M1 may represent a thin-oxide device, and transistor M2 may represent a thick-oxide device (i.e., a gate oxide layer of transistor M2 may be thicker than a gate oxide layer of transistor M1). In a metal-oxide-semiconductor field-effect transistor (MOSFET), gate oxide is a dielectric layer that separates a gate from a source and a drain, and from a conductive channel that connects the source and drain, when the MOSFET is turned on. Channel lengths of transistors M1 through M5 may be substantially equal to one another, such that voltage swings of controls ARYSD 118, SDB 120, PD 122, and PSHRT 124 are substantially the same.

Table 1 illustrates ON/OFF states of transistors M1 through M5 of bias circuitry 102, for the operating mode, the retention mode, and the non-retention mode.

TABLE 1

| Device | Operating Mode | Retention Mode | Non-Retention Mode |
|---|---|---|---|
| M1 | On | On | Off |
| M2 | On | On | Off |
| M3 | Off | Off | On |
| M4 | On | On | Off |
| M5 | Off | On | Off |

Circuit 100 may include control circuitry that generates one or more of controls ARYSD 118, SDB 120, PD 122, and PSHRT 124. Alternatively, or additionally, external (e.g., off-chip) control circuitry may generate one or more of controls ARYSD 118, SDB 120, PD 122, and PSHRT 124.

Table 2 illustrates states of controls ARYSD 118, SDB 120, PD 122, PGATE 115, and PSHRT 124, for the operating mode, the retention mode, and the non-retention mode, for the example P-type and N-type devices of FIG. 1.

TABLE 2

| Control | Operating Mode | Retention Mode | Non-Retention Mode |
|---|---|---|---|
| ARYSD 118 | Low | Low | High |
| SDB 120 | High | High | Low |
| PD 122 | High | High | Low |
| PGATE 115 | Low | Low | High |
| PSHRT 124 | Low | High | Low |

Figure 2:
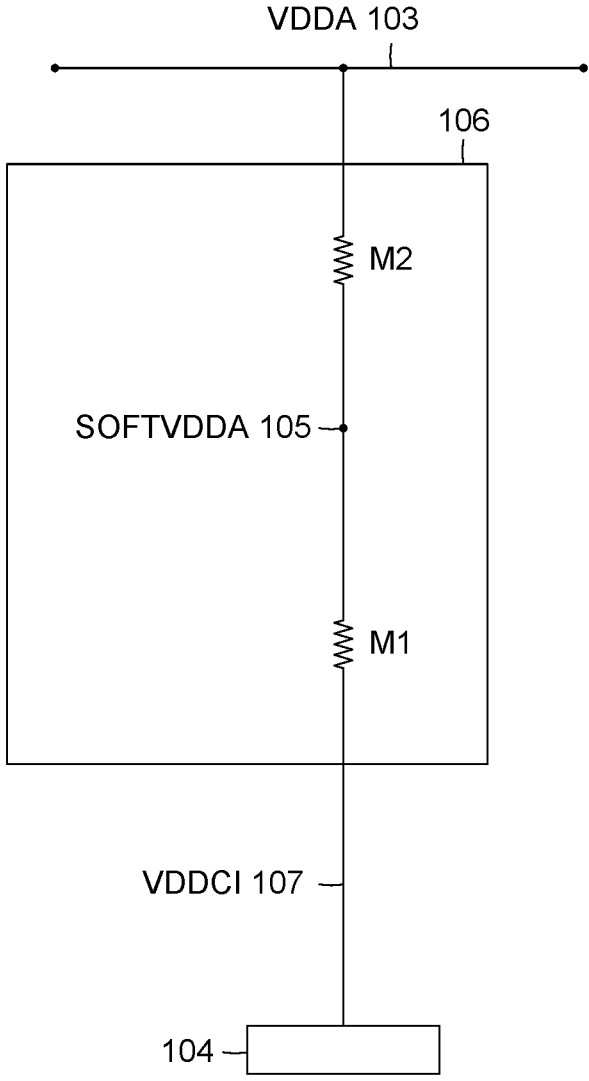
FIG. 2 is an equivalent schematic diagram of a power gate circuit of FIG. 1, showing first and second power gate transistors in an operating mode, according to an embodiment.

FIG. 2 is an equivalent schematic diagram of FIG. 1 showing transistors M1 and M2 in the operating mode, according to an embodiment. Transistors M1 and M2 are turned on in the operating mode, thus they are represented as resistances in the operating mode.

Figure 3:
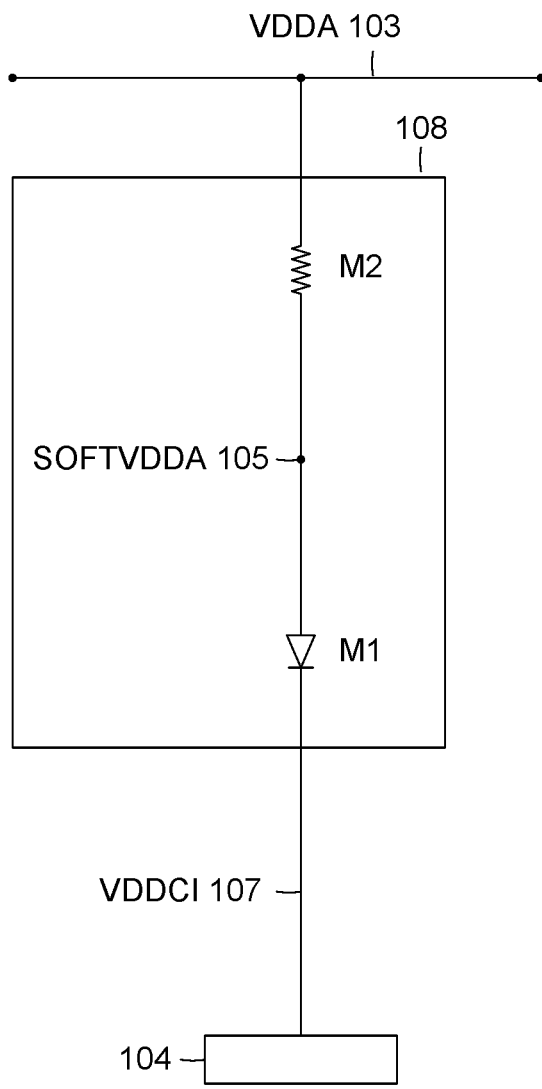
FIG. 3 is an equivalent schematic diagram of the power gate circuit of FIG. 1, showing the first and second power gate transistors in a retention mode, according to an embodiment.

FIG. 3 is an equivalent schematic diagram of power gate circuit 106 of FIG. 1, showing transistors M1 and M2 in the retention mode, according to an embodiment. Transistors M1 and M2 are turned on while transistor M5 is turned on in the retention mode, thus M2 is represented as a resistance and M1 is represented as a diode.

Figure 4:
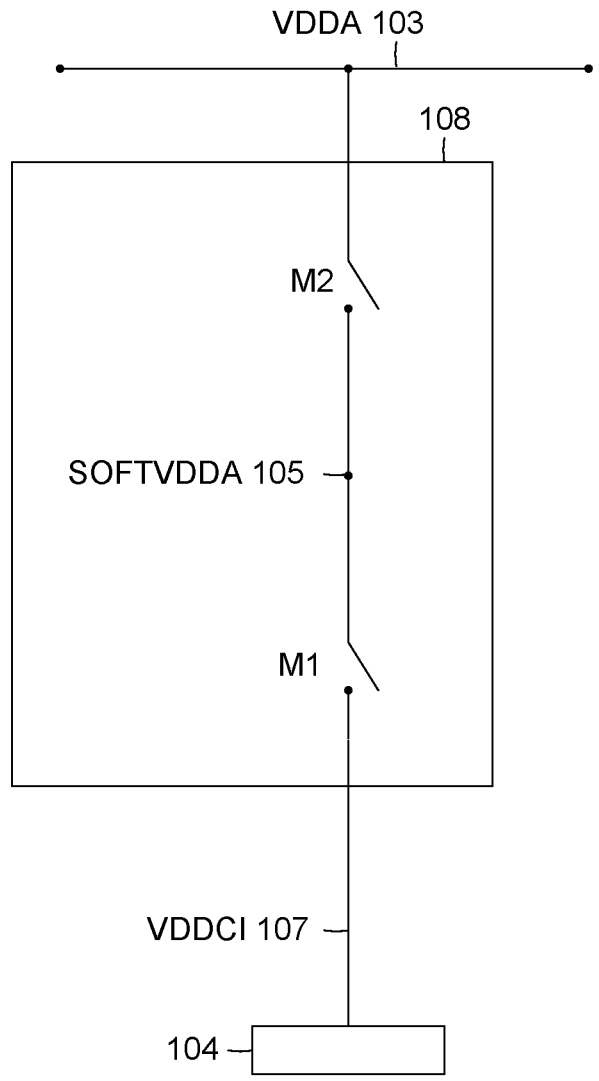
FIG. 4 is an equivalent schematic diagram of the power gate circuit of FIG. 1, showing the first and second power gate transistors in a non-retention (i.e., shutdown) mode, according to an embodiment.

FIG. 4 is an equivalent schematic diagram of FIG. 1 showing transistors M1 and M2 in the non-retention mode, according to an embodiment. Transistors M1 and M2 are turned off in the non-retention mode, thus M1 and M2 are represented as open circuits.

Figure 5:
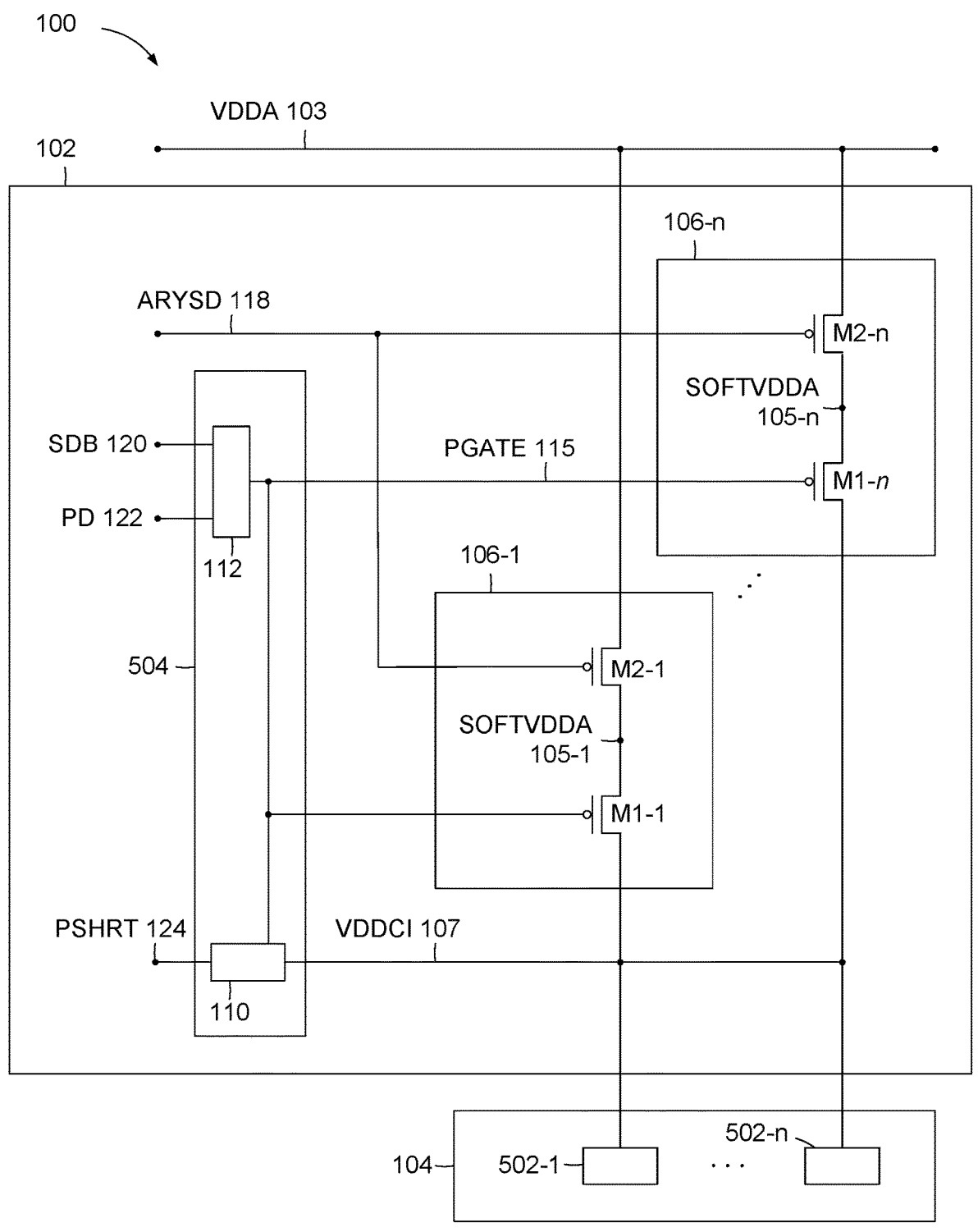
FIG. 5 is a schematic diagram of the circuit in which the bias circuitry includes multiple power gate circuits that provide voltages to multiple respective portions of the load (e.g., multiple regions of memory cells), according to an embodiment.

FIG. 5 is a schematic diagram of circuit 100, in which bias circuitry 102 includes multiple power gate circuits, 106-1 through 106-n (collectively, power gate circuits 106), that provide power to multiple respective portions or regions 502-1 through 502-n of load 104, according to an embodiment. Regions 502 may represent regions of memory cells. Power gate circuits 106-1 through 106-n may be placed physically proximate to (i.e., distributed amongst) respective regions 502, as respective input/output (IO) circuits, whereas control circuit 112 and voltage reduction circuit 110 (e.g., diode-connecting transistor M5), may be placed in a central region 504.

As an example, and without limitation, a distance between a power gate circuit 106 and a corresponding region 502 may be within a range of approximately 2 micrometers (m) to 5 μm. The distance may depend on a fabrication process. A distance between region 504 and a power gate circuit 106 may be within a range of approximately 2 m and 80 m. The distance may depend on the fabrication process and IO circuits supported by the centralized circuitry (i.e., control circuit 112 and voltage reduction circuit 110) within central region 504.

Where power gate circuits 106 are distributed amongst regions 502 of load 104, region 502 may source power/current predominately from the respective power gate circuits 106, which may reduce losses.

As the number of power gate circuits 106 increases, any leakage losses in power gate circuits 106 become increasingly significant, which may be mitigated by respective second transistors M2-1 through M2-n.

In the example of FIG. 5, bias circuitry 102 includes a single instance of control circuit 112 to control power gate circuits 106-1 through 106-n. Alternatively, bias circuitry may include multiple instances of control circuit 112 that control individual power gate circuits 106 and/or groups of power gate circuits 106 (e.g., to separately control modes of respective regions 502 of load 104).

Further in the example of FIG. 5, bias circuitry 102 includes a single instance of voltage reduction circuit 110 that reduces voltage VDDCI 107 of all regions 502 of load 104, in the retention mode. Alternatively, bias circuitry 102 may include multiple voltage reduction circuits 110 that reduce voltage VDDCI 107 for individual regions 502 and/or groups of regions 502.

Further in the example of FIG. 5, transistors M2-1 through M2-n are controlled in unison by control ARYSD 118. Alternatively, transistors M2-1 through M2-n, or a subset thereof, may be controlled by respective ARYSD controls.

Figure 6A:
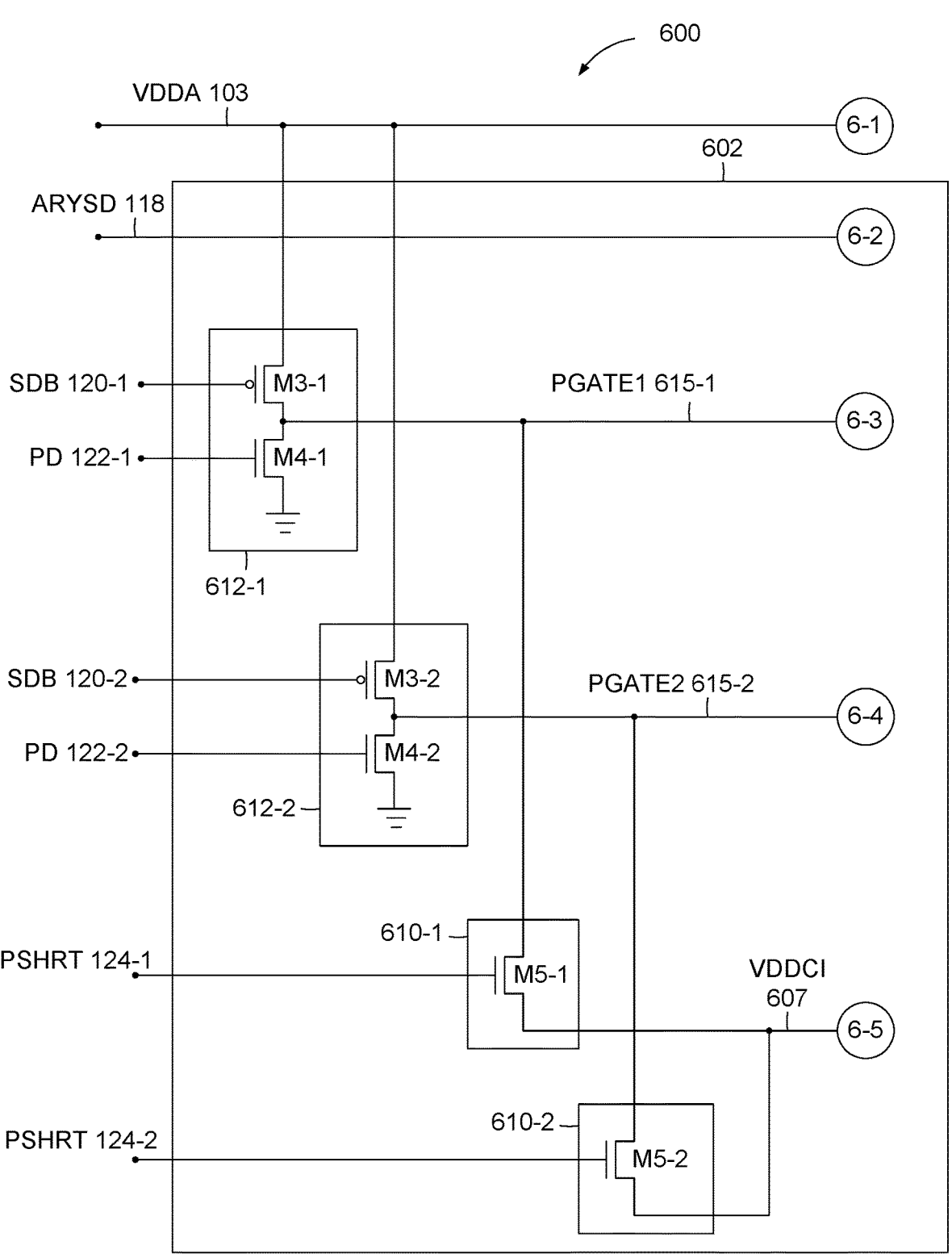
FIGS. 6A and 6B illustrate a schematic diagram of another circuit that includes bias circuitry that controls a voltage of a load (e.g., memory cells), according to an embodiment.
Figure 6B:
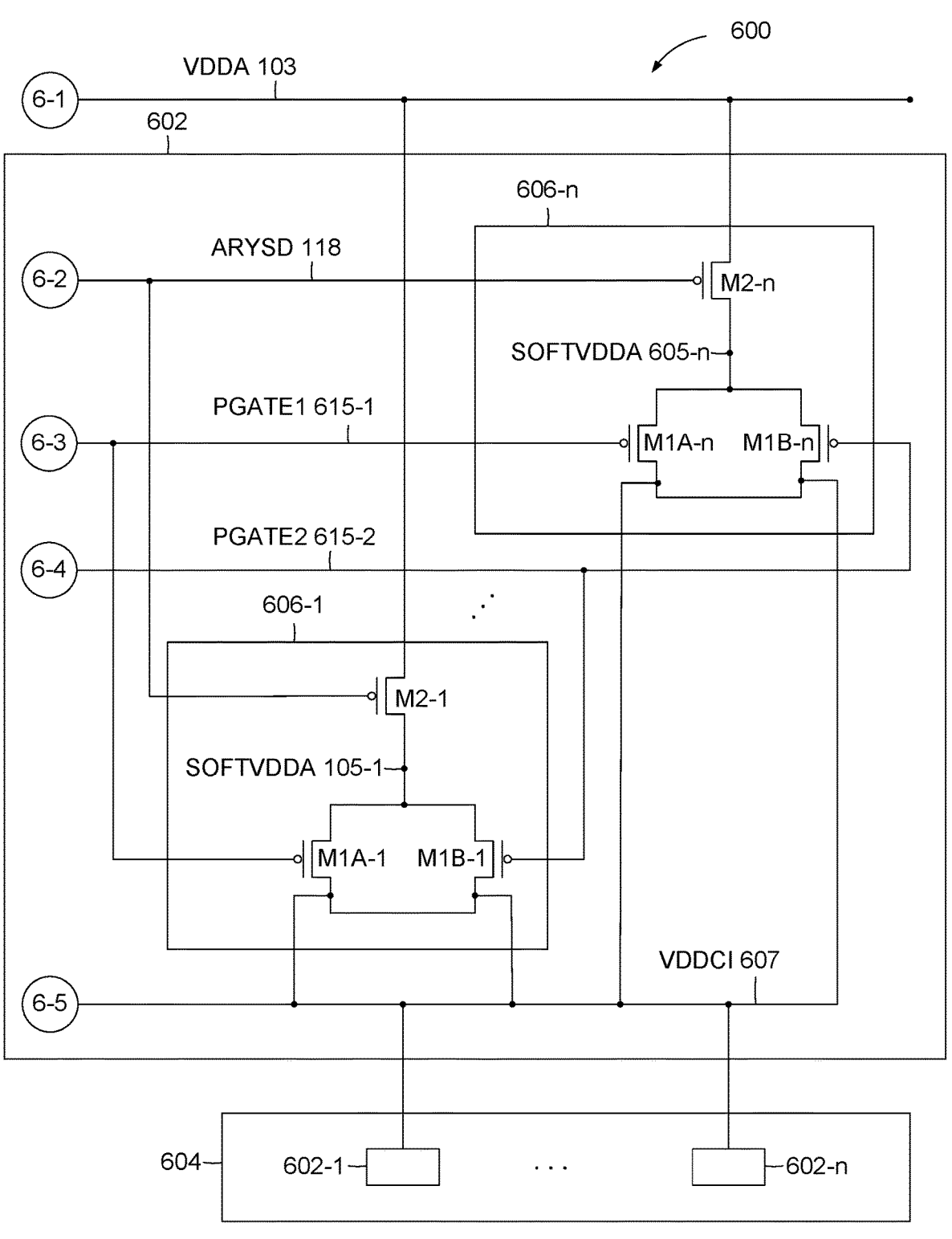

In FIG. 1 and/or FIG. 5, transistor M1 may represent multiple parallel transistors, such as described below with reference to FIGS. 6A and 6B. FIGS. 6A and 6B illustrate a schematic diagram of a circuit 600 that includes bias circuitry 602 that controls a voltage VDDCI 607 of a load 604, according to an embodiment. In FIG. 6B, bias circuitry 602 includes multiple power gate circuits 606-1 through 606-n (collectively, power gate circuits 606), that provide power to portions or regions 602-1 through 602-n of load 604. Regions 602 may represent regions of memory cells. In FIG. 6B, power gate circuits 606-1 through 606-n include multiple individually controllable, parallel, low $V_T$ transistors. Multiple parallel transistors may be useful to provide finer granular control (i.e., additional levels of control) over voltage VDDCI 607, such as described further below.

In the example of FIG. 6B, power gate circuit 606-1 includes two parallel M1 transistors, M1A-1 and M1B-1. Similarly, power gate circuit 106-n includes two parallel M1 transistors, M1A-n and M1B-n. In an embodiment, one or more of power gate circuits 606 may include more than two parallel M1 transistors. Alternatively, or additionally, a subset of power gate circuits 606 may include a single M1 transistor.

Threshold voltages of transistors M1A-1 and M1B-1 may be the same, or may differ from one another. Threshold voltages of transistors M1A-n and M1B-n may be the same, or may differ from one another. Threshold voltages of transistors M1A-1 through M1A-n may be the same, or may differ from one another. Threshold voltages of transistors M1B-1 through M1B-n may be the same, or may differ from one another.

In FIG. 6A, bias circuitry 602 includes a first control circuit 612-1 that controls states of transistors M1A-1 through M1A-n with a control PGATE1 615-1, based on a control SDB 120-1 and a control PD 122-1, such as described further above with reference to control circuit 112 in FIG. 1. Bias circuitry 602 further includes a second control circuit 612-2 that controls states of transistors M1B-1 through M1B-n with a control PGATE2 615-2, based on a control SDB 120-2 and a control PD 122-2.

Bias circuitry 602 further includes a first voltage reduction circuit 610-1 that includes a transistor M5-1 that diode-connects transistors M1A-1 through M1A-n based on a control PSHRT 124-1, such as described further above with reference to voltage reduction circuit 110 FIG. 1. Bias circuitry 602 further includes a second voltage reduction circuit 610-2 that includes a transistor M5-2 that diode-connects transistors M1B-1 through M1B-n based on a control PSHRT 124-2. Where power gate circuits 606 include more than two M1 transistors, bias circuitry 602 may include one or more additional control circuits 612 and voltage reduction circuits 610.

In the operating mode, transistors M2, M1A-1 through M1A-n, and M1B-1 through M1B-n are ON, and transistors M5-1 and M5-2 are OFF, such that voltage VDDCI 607 is substantially equal to voltage VDDA 103.

In the retention mode, transistor M2 is ON, transistors M1A-1 through M1A-n are diode-connected (i.e., transistor M5-1 is ON), and transistors M1B-1 through M1B-n are diode-connected (i.e., transistor M5-2 is ON) or OFF, such that voltage VDDCI 607 is less than voltage VDDA 103 (e.g., a minimum retention voltage). A decision to diode-connect transistors M1B-1 through M1B-n, in the retention mode, may be based on one or more of a variety of factors, such as the number n of power gate circuits 606, threshold voltages of transistors M1A-1 through M1A-n and transistors M1B-1 through M1B-n, and/or factors associated with load 604 (e.g., numbers of columns/bits of regions 602).

For example, in the retention mode, the voltage drop across power gate circuits 606 (and thus voltage VDDCI 607), depends in part on the number of power gate circuits 606 (i.e., n), and threshold voltages of the diode-connected transistors. Generally, for a given threshold voltage, the voltage drop across power gate circuits 606 decreases (i.e., voltage VDDCI 607 increases) with increasing numbers of power gate circuits 606. A decision to diode-connect transistors M1B-1 through M1B-n, in the retention mode, may thus be based at least in part on the number of power gates 606. In addition, during a circuit design phase, properties of transistors M1A-1 through M1A-n and/or transistors M1B-1 through M1B-n (e.g., properties that impact threshold voltages) may be selected based on the number of power gate circuits 606 and/or features of load 604 (e.g., columns/bits of regions 602), to provide a desired voltage VDDCI 607 in the retention mode.

In the non-retention mode, transistor M2, transistors M1A-1 through M1A-n, and transistors M1B-1 through M1B-n are OFF.

Table 3 illustrates ON/OFF states of transistors of bias circuitry 602, for the operating mode, the retention mode (for an example in which transistors M1A-1 through M1A-n are diode-connected and transistors M1B-1 through M1B-n are OFF), and the non-retention mode.

TABLE 3

| Device | Operating Mode | Retention Mode | Non-Retention Mode |
|---|---|---|---|
| M2-1 through M2-n | ON | ON | OFF |
| M1A-1 through M1A-n | ON | ON | OFF |
| M3-1 | OFF | OFF | ON |
| M4-1 | ON | ON | OFF |
| M5-1 | OFF | ON | OFF |
| M1B-1 through M1B-n | ON | OFF | OFF |
| M3-2 | OFF | ON | ON |
| M4-2 | ON | OFF | OFF |
| M5-2 | OFF | OFF | OFF |

Table 4 illustrates states of controls ARYSD 118, SDB 120-1 and 120-2, PD 122-1 and 122-2, PGATE 115-1 and 115-2, and PSHRT 124-1 and 124-2, for the operating mode, the retention mode (for the example in which transistors M1A-1 through M1A-n are diode-connected and transistors M1B-1 through M1B-n are OFF), and the non-retention mode, for the example P-type and N-type devices of FIGS. 6A and 6B.

TABLE 4

| Control | Operating Mode | Retention Mode | Non-Retention Mode |
|---|---|---|---|
| ARYSD 118 | Low | Low | High |
| SDB 120-1 | High | High | Low |
| PD 122-1 | High | High | Low |
| PGATE 115-1 | Low | Low | High |
| PSHRT 124-1 | Low | High | Low |
| SDB 120-2 | High | Low | Low |
| PD 122-2 | High | Low | Low |
| PGATE 115-2 | Low | High | High |
| PSHRT 124-2 | Low | Low | Low |

Figure 7:
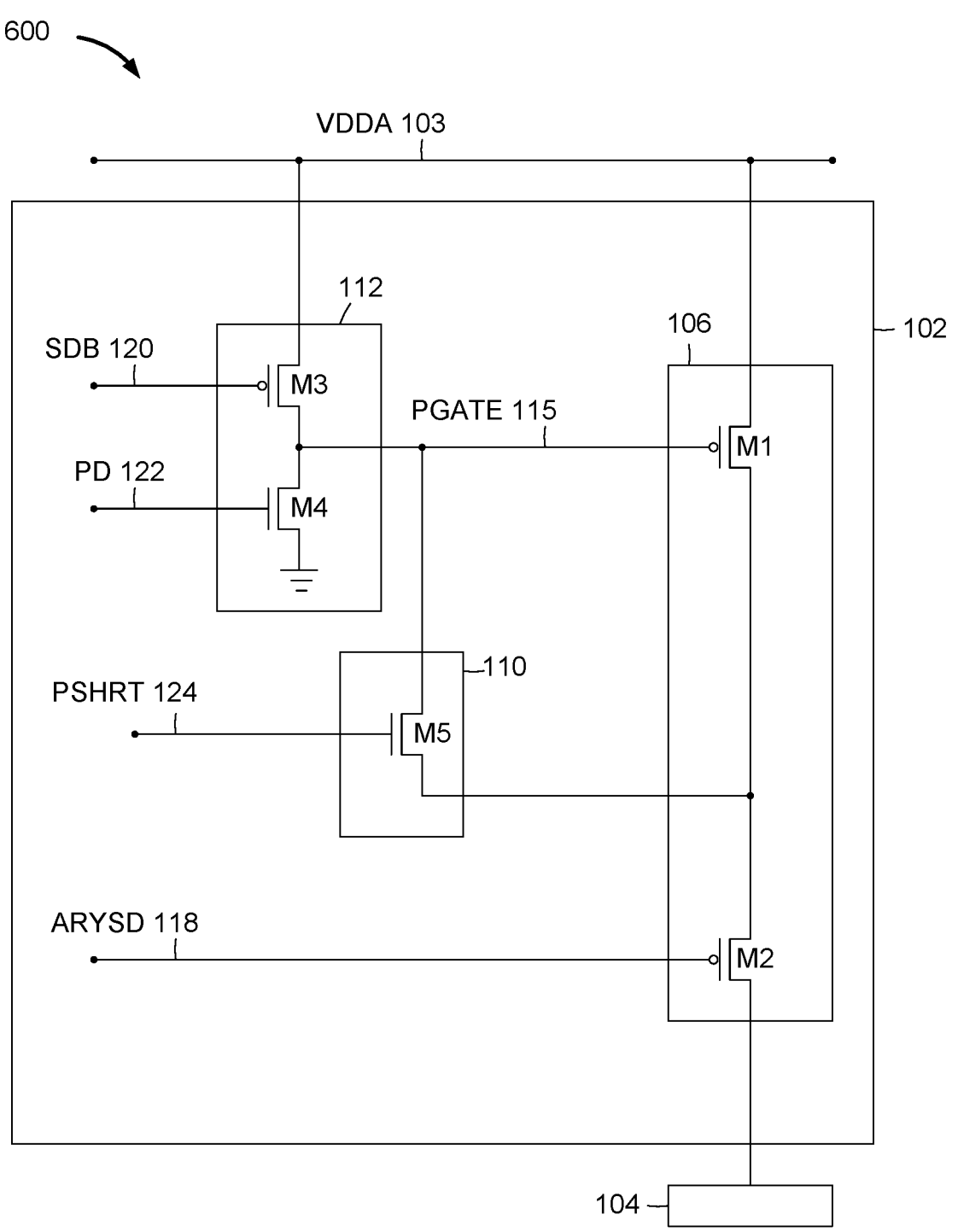
FIG. 7 is another schematic diagram of the circuit of FIG. 1, according to an embodiment.

In examples above, transistor M1 is coupled between transistor M2 and load 104, and transistor M2 is coupled between a source of voltage VDDA 103 and transistor M1. FIG. 7 is a schematic diagram of circuit 100 in which, transistor M2 is coupled between transistor M1 and load 104, and transistor M1 is coupled between the source of voltage VDDA 103 and transistor M2, according to an embodiment. Bias circuitry 102 of FIG. 7 may include multiple power gate circuits 106 that provide power to multiple respective portions or regions of load 104, such as described above with reference to FIG. 5. Alternatively, or additionally, transistor M1 in FIG. 7 may represent multiple parallel transistors, such as described above with reference to FIGS. 6A and 6B.

In the foregoing examples, transistors M1 and M2 are illustrated as series-coupled (i.e., source-to-drain), without any other component(s) coupled to and/or between the source-to-drain coupling. In other embodiments, transistors M1 and M2 may be series-coupled with one or more components coupled to and/or between the source of one of transistors M1 and M2 and the drain of the other one of transistors M1 and M2.

Experimental results provided in Table 5 below, shows a leakage saving of approximately 50% for a verified memory instance as disclosed herein (e.g., circuit 100 or circuit 600). Methods and systems disclosed herein are not, however, limited to the experimental results.

TABLE 5

| Instance | Example Memory Instance |
|---|---|
| Evaluation Corner | Process: TT; VDD: 0.75 v; Temp: 25 c. |
| Current leakage in the non-retention mode if transistor M2 is omitted | 3.69 micro Amperes (μAmps) |
| Current leakage in the non-retention mode when transistor M2 is included | 1.84 μAmps |
| Reduction in current leakage in the non-retention mode when transistor M2 is included | 50.6% |

In Table 5, evaluation corner parameters VDD, Temp, and TT relate to fabrication parameters of the verified memory instance. Process corners generally represent fabrication parameter variation extremes, within which a circuit that has been etched onto a wafer must function correctly. More generally, to verify the robustness of an integrated circuit design, semiconductor manufacturers fabricate "corner lots," which are groups of etched wafers for which process parameters have been adjusted according to various extremes (i.e., process corners). Circuits etched into the wafers are then tested at varying increments of environmental conditions, such as voltage, clock frequency, and temperature, in a process called characterization.

Process corners may affect the speed at which a transistor switches logic states, at various temperatures and voltages. The semiconductor industry uses a two-letter designation to describe the different corners, where the first letter refers to an NMOS device, and the second refers to a PMOS device. There are 5 classic corners, FF (fast fast), SF (slow fast), SS (slow slow), FS (fast slow), and TT (typical typical). Fast and slow corners exhibit carrier mobilities that are higher and lower than normal, respectively. The TT corner is the center corner where wafers are normally produced (e.g. typical process parameters). In other words, the TT "corner" is not actually a variation extreme of an n vs. p mobility graph.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A circuit, comprising:
bias circuitry that controls a supply voltage of a load, the bias circuitry comprising:
a first power gate circuit comprising a first transistor and a second transistor connected in series,
wherein a threshold voltage of the first transistor is less than a threshold voltage of the second transistor; and
wherein a gate of the second transistor is coupled to a shutdown control signal that turns OFF the second transistor during a shutdown mode and turns ON the second transistor during an operating mode.

2. The circuit of claim 1, wherein the threshold voltage of the first transistor is within a range of 30% to 80% of the threshold voltage of the second transistor.

3. The circuit of claim 1, wherein the bias circuitry further comprises:
a third transistor that diode-connects the first transistor; and
control circuitry that turns ON the first and second transistors to set the supply voltage to a first voltage in an operating mode, turns ON the third transistor to diode-connect the first transistor to reduce the operating voltage to a second voltage in a reduced power consumption mode, and turns OFF the first, second, and third transistors to reduce the operating voltage to zero volts in a shutdown mode.

4. The circuit of claim 3, wherein the load comprises a memory cell, and wherein the second voltage is at least a minimum data retention voltage of the memory cell.

5. The circuit of claim 1, wherein the first power gate circuit further comprises a third transistor in parallel with the first transistor, wherein a threshold voltage of the third transistor is less than the threshold voltage of the second transistor, and wherein the bias circuitry further comprises:
a fourth transistor that diode-connects the first transistor; and
a fifth transistor that diode-connects the third transistor; and
control circuitry that turns ON the first, second, and third transistors to set the supply voltage to a first voltage in an operating mode, and turns ON the fourth transistor to diode-connect the first transistor to reduce the operating voltage to a second voltage in a reduced power consumption mode.

6. The circuit of claim 5, wherein the control circuitry further turns ON the fifth transistor to diode-connect the third transistor in the reduced power consumption mode.

7. The circuit of claim 5, wherein the control circuitry further turns OFF the third transistor in the reduced power consumption mode.

8. The circuit of claim 5, wherein:
the bias circuitry further comprises a second power gate circuit comprising sixth and seventh transistors connected in parallel, and an eighth transistor connected in series with the sixth and seventh transistors, wherein threshold voltages of the sixth and seventh transistors are less than a threshold voltage of the eighth transistor, and wherein outputs of the first and second power gate circuits are coupled to one another and to the load;
the fourth transistor further diode-connects the sixth transistor;
the fifth transistor further diode-connects the seventh transistor; and
the control circuitry further turns ON the sixth, seventh, and eighth transistors in the operating mode, and turns ON the fourth transistor to further diode-connect the sixth transistor in the reduced power consumption mode.

9. The circuit of claim 8, wherein the control circuitry further turns ON the fifth transistor to diode-connect the third transistor and the seventh transistor in the reduced power consumption mode.

10. The circuit of claim 8, wherein the control circuitry further turns OFF the third transistor and the seventh transistor in the reduced power consumption mode.

11. A non-transitory computer readable medium comprising stored instructions, which when executed by a processor, cause the processor to:

generate a circuit design that comprises bias circuitry that controls a supply voltage of a load, the bias circuitry comprising:

a first power gate circuit comprising a first transistor and a second transistor connected in series, wherein the bias circuitry controls the first transistor independent of the second transistor; and wherein a gate of the second transistor is coupled to a shutdown control signal that turns OFF the second transistor during a shutdown mode and turns ON the second transistor during an operating mode.

12. The non-transitory computer readable medium of claim 11, wherein a threshold voltage of the first transistor is less than a threshold voltage of the second transistor.

13. The non-transitory computer readable medium of claim 12, wherein the threshold voltage of the first transistor is within a range of 30% to 80% of the threshold voltage of the second transistor.

14. The non-transitory computer readable medium of claim 11, wherein the bias circuitry further comprises:

a third transistor that diode-connects the first transistor; and control circuitry that turns ON the first and second transistors to set the supply voltage to a first voltage in an operating mode, and turns ON the third transistor to diode-connect the first transistor to reduce the operating voltage to a second voltage in a reduced power consumption mode.

15. The non-transitory computer readable medium of claim 11, wherein the first power gate circuit further comprises a third transistor in parallel with the first transistor, wherein a threshold voltage of the third transistor is less than the threshold voltage of the second transistor, and wherein the bias circuitry further comprises:

a fourth transistor that diode-connects the first transistor;

a fifth transistor that diode-connects the third transistor; and control circuitry that turns ON the first, second, and third transistors to set the supply voltage to a first voltage in an operating mode, and turns ON the fourth transistor to diode-connect the first transistor to reduce the operating voltage to a second voltage in a reduced power consumption mode.

16. The non-transitory computer readable medium of claim 15, wherein the control circuitry further turns ON the fifth transistor to diode-connect the third transistor in the reduced power consumption mode.

17. The non-transitory computer readable medium of claim 15, wherein the control circuitry further turns OFF the third transistor in the reduced power consumption mode.

18. A method, comprising:

activating first and second controls to turn ON respective first and second series-connected transistors of a first power gate circuit to set a supply voltage of a load to a first voltage in an operating mode, wherein a threshold voltage of the first transistor is less than a threshold voltage of the second transistor;

activating a third control to turn ON a third transistor to diode-connect the first transistor to reduce the operating voltage to a second voltage in a reduced power consumption mode; and deactivating the first, second, and third controls to turn OFF the first, second, and third transistors, respectively, to reduce the operating voltage to zero volts in a shutdown mode.

19. The method of claim 18, further comprising:

activating a fourth control to turn ON a fourth transistor that is connected in parallel with the first transistor, in the operating mode, wherein a threshold voltage of the fourth transistor is less than the threshold voltage of the second transistor; and selectively activating a fifth control to turn ON a fifth transistor to diode-connect the fourth transistor or deactivating the fourth control to turn OFF the fourth transistor, in the reduced power consumption mode.

20. The method of claim 18, wherein:

the threshold voltage of the first transistor is within a range of 75 millivolts to 125 millivolts; and the threshold voltage of the second transistor is within a range of 275 millivolts to 325 millivolts.

* * * * *